(12) United States Patent
Friz et al.

(10) Patent No.: US 8,029,923 B2
(45) Date of Patent: Oct. 4, 2011

(54) VAPORIZING MATERIAL FOR PRODUCING HIGHLY REFRACTIVE OPTICAL LAYERS

(75) Inventors: Martin Friz, Darmstadt (DE); Reiner Dombrowski, Hoechst (DE); Beate Dombrowski, legal representative, Hoechst (DE); Uwe Anthes, Erbach (DE)

(73) Assignee: Merck Patent GmbH, Darmstadt (DE)

( * ) Notice: Subject to any disclaimer, the term of this patent is extended or adjusted under 35 U.S.C. 154(b) by 930 days.

(21) Appl. No.: 10/546,026

(22) PCT Filed: Jan. 23, 2004

(86) PCT No.: PCT/EP2004/000553
§ 371 (c)(1),
(2), (4) Date: Apr. 22, 2010

(87) PCT Pub. No.: WO2004/074539
PCT Pub. Date: Sep. 2, 2004

(65) Prior Publication Data
US 2006/0083949 A1    Apr. 20, 2006

(30) Foreign Application Priority Data
Feb. 19, 2003  (DE) .................................. 103 07 117

(51) Int. Cl.
*B32B 15/00*    (2006.01)
*C22B 1/16*    (2006.01)
*C04B 35/01*    (2006.01)
*C23C 16/00*    (2006.01)

(52) U.S. Cl. ............ 428/702; 428/697; 75/765; 75/235; 75/313; 75/255; 501/134; 427/124; 427/248.1

(58) Field of Classification Search .................. 428/472, 428/633, 697, 701, 702; 501/42, 134; 75/765, 75/235, 313, 255; 427/124, 248.1
See application file for complete search history.

(56) References Cited

U.S. PATENT DOCUMENTS

| 4,501,799 A | | 2/1985 | Driessen et al. |
| 4,753,902 A | * | 6/1988 | Ketcham .......................... 501/87 |
| 5,747,397 A | * | 5/1998 | McPherson et al. ............ 501/51 |
| 6,258,467 B1 | * | 7/2001 | Subramanian ................ 428/633 |
| 6,503,861 B1 | | 1/2003 | Murakawa |
| 2003/0096694 A1 | * | 5/2003 | Kasuga et al. .................. 501/73 |

FOREIGN PATENT DOCUMENTS

| EP | 1 020 416 | 7/2000 |
| GB | 1 162 822 | 8/1969 |
| JP | 01 108124 | 4/1989 |

OTHER PUBLICATIONS

Patent Abstracts of Japan; vol. 013, No. 328; Jul. 24, 1989.
V.D. Kushkov et al., "Structure of the $Ln_2TI_2)_7$ thin films prepared by pulsed-laser evaporation", (1993) pp. 361-363.
Patent Abstracts of Japan, Publication No. 09-241830, dated Sep. 16, 1997.
A.M. Zaslavskii et al., "Synthesis and structure of $R_2TiO_5$ thin films", Journal of Materials Science, vol. 12 (1993), pp. 350-351.
$SrO-Gd_2O_3-TiO_2$; No. 100871, dated Feb. 1995.
Abstract: Yaqin et al., "Synthesis and Spectral Characteristics of NaLnTiO".

* cited by examiner

*Primary Examiner* — Tomothy M Speer
*Assistant Examiner* — Lauren Robinson
(74) *Attorney, Agent, or Firm* — Millen, White, Zelano & Branigan, P.C.

(57) ABSTRACT

The invention relates to a vapour-deposition material for the production of optical layers of high refractive index which comprises titanium oxide and gadolinium oxide and/or dysprosium oxide, to a process for the preparation thereof, and to the use thereof.

15 Claims, No Drawings

VAPORIZING MATERIAL FOR PRODUCING HIGHLY REFRACTIVE OPTICAL LAYERS

The invention relates to a vapour-deposition material for the production of optical layers of high refractive index which comprises titanium oxide in a mixture with gadolinium oxide and/or dysprosium oxide.

Optical components are usually provided with thin coatings which are applied for protection of the surfaces or in order to achieve certain optical properties.

Optical components of this type are, for example, optical lenses, spectacle lenses, lenses for cameras, binoculars or for other optical instruments, beam splitters, prisms, mirrors, window panes and the like.

The coatings serve firstly for the treatment of the said surfaces by hardening and/or increasing the chemical resistance in order to reduce or prevent damage by mechanical, chemical or environmental influences, but frequently also secondly to achieve reduced reflection, which is the case, in particular, for spectacle lenses and camera lenses. By selecting suitable coating materials, different layer thicknesses and single- or multilayered structures comprising, where appropriate, different materials having different refractive indices, it is possible to achieve a reduction in the reflection to less than 1% over the entire visible radiation spectrum. By suitable combinations of various materials in suitable layer thicknesses, interference mirrors, beam splitters, heat filters or cold-light mirrors can also be produced.

In order to produce the above-mentioned coating layers, various, in particular oxidic materials are known, such as, for example, $SiO_2$, $TiO_2$, $ZrO_2$, MgO, $Al_2O_3$, but also fluorides, such as $MgF_2$, and mixtures of these substances.

The coating materials are selected here in accordance with the target optical properties and in accordance with the processing properties of the materials.

The coating of optical substrates is usually carried out using a high-vacuum vapour-deposition process. In this, firstly the substrate and a flask containing the vapour-deposition substance are placed in a suitable high-vacuum vapour-deposition apparatus, the apparatus is subsequently evacuated, and the vapour-deposition substance is evaporated by heating and/or electron beam bombardment, with the vapour-deposition material precipitating on the substrate surface in the form of a thin layer. Corresponding apparatuses and processes are conventional prior art.

The choice of starting materials which are suitable for the production of layers of high refractive index, i.e. having a refractive index of 2 or greater, is comparatively limited. Suitable here are essentially the oxides of titanium, zirconium, hafnium and tantalum and mixed oxides thereof. The most frequently employed is titanium oxide. The layers produced therefrom are transparent in the visible and near infrared spectral range from about 380 nm to 5 µm and should, like the starting material, have no significant absorption. The refractive index which can be achieved with titanium oxide at a wavelength of about 500 nm is about 2.4. However, absorption is observed on UV irradiation.

In particular in the case of pure titanium(IV) oxide, the risk also arises that a loss of oxygen occurs during evaporation, resulting in deposition of sub-stoichiometric titanium oxide layers and thus in layers which absorb in the visible region. This can be prevented by means of suitable measures during the evaporation, such as, for example, the establishment of an oxygen residual pressure, or alternatively by the addition of certain substances, such as, for example, in accordance with German Patent 12 28 489, of elements or oxides from the rare-earth group. Mention was made here, inter alia, of mixtures of titanium oxide with praseodymium and/or praseodymium oxide or mixtures of titanium oxide with cerium and/or cerium oxide.

However, the relative freedom from absorption of these known mixtures is restricted to the visible spectral region. By contrast, German Patent 12 28 489 makes no mention of the ultraviolet or near infrared spectral region.

A further disadvantage of the pure oxides consists in that they generally have high melting and boiling points, which in addition are also close together. For processing reasons, however, it is advisable for the vapour-deposition materials to be completely melted before commencement of significant evaporation. Only in this way is it possible to achieve a uniform and adequate evaporation rate, which is necessary for the formation of homogeneous layers of uniform thickness. Under the usual working conditions, however, difficulties with respect to melting occur, in particular in the case of the oxides of zirconium and hafnium, and also in the case of titanium/zirconium mixed oxides.

The resultant layers are often optically inhomogeneous and, in the case of the usual multiple application, result in difficulties in the reproducibility of the refractive indices.

For this reason, materials which are intended to lower the melting point of the metal oxide and are also employed, inter alia, for specific variation of the refractive indices are also added to the pure metal oxides. However, these materials should be selected so that significant absorption does not occur in the visible region in the layers formed.

However, it has proven disadvantageous that mixtures of the above-mentioned metal oxides evaporate incongruently with melting point-lowering additives, i.e. they change their composition in the course of the evaporation process and the composition of the deposited layer is also changed correspondingly.

In order to solve this problem, mixed oxides, such as, for example, $La_2Ti_2O_7$, have been proposed. However, these give off oxygen, in a similar way to titanium(IV) oxide, during evaporation, resulting in sub-stoichiometric composition of the deposited layers and thus in absorption phenomena.

In addition to the metal oxides already mentioned above which are suitable for the production of layers of high refractive index, other publications have also already mentioned oxides of the rare-earth metals.

Thus, for example, mixtures of praseodymium oxide and titanium dioxide are known. These have strong absorption in the spectral region below 400 nm and weak absorption in the visible spectral region due to absorption of the praseodymium ion.

Mixtures of lanthanum oxide and titanium oxide have also already been proposed a number of times, for example in DE 42 08 811 and in DE 100 65 647. However, the lanthanum oxide content results in increased sensitivity to moisture in the layers produced therewith. In addition, the natural radioactive isotope of lanthanum may cause damage to sensitive optical components due to its radioactive radiation.

U.S. Pat. No. 4,794,607 describes the use of gadolinium oxide layers alternating with aluminium oxide layers which serve as antireflection coating for an optical amplifier. Investigations of this material have shown that homogeneous layers having refractive indices of 1.75 or 1.80, depending on the application method, can be obtained by vapour deposition with gadolinium oxide (K. Truszkowska, C. Wesolowska, "Optical properties of evaporated gadolinium oxide films in the region 0.2-5 µm", Thin Solid Films (1976), 34(2), 391-4).

The layers produced are thus well away from a target refractive index of 2 or greater.

DE-A 3335557 discloses using alternating layers of titanium dioxide and ytterbium oxide or layer sequences of aluminium oxide and ytterbium oxide for the production of antireflection coatings on optical lenses.

It is known that ytterbium oxide can achieve refractive indices of from 1.75 to 1.9, depending on the thickness of the applied layers and depending on the application method. These refractive indices are likewise not in the high-refractive-index range.

Also known are mixtures of titanium oxide with dysprosium oxide and/or ytterbium oxide, but these are, according to WO 95/05670, applied to photovoltaic cells in order to produce semiconducting metal-oxide layers in the sol/gel process.

No information is given on the achievable refractive indices of the layers produced.

The object of the present invention was therefore to provide a vapour-deposition material for the production of layers having a high refractive index of at least 2.0 which has high durability, is insensitive to moisture, acids and alkalis, has low radioactivity, is transparent and non-absorbent over a broad spectral range and does not change its original composition during melting and evaporation and which is suitable for the production of layers of high refractive index having the same properties.

This object is achieved in accordance with the present invention by a vapour-deposition material for the production of optical layers of high refractive index, comprising titanium oxide and gadolinium oxide and/or dysprosium oxide.

The object according to the invention is furthermore achieved by a process for the preparation of a vapour-deposition material for the production of optical layers of high refractive index, in which titanium oxide is mixed with gadolinium oxide and/or dysprosium oxide, the mixture is compressed or suspended, shaped and subsequently sintered.

The invention additionally relates to the use of a vapour-deposition material comprising titanium oxide and gadolinium oxide and/or dysprosium oxide for the production of optical layers of high refractive index.

In an embodiment according to the invention, the vapour-deposition material comprises titanium dioxide and gadolinium oxide ($Gd_2O_3$) and/or dysprosium oxide ($Dy_2O_3$). These materials may be present in a molar ratio of from 4:1 to 1:4, where the last number in each case relates to the molar proportion of gadolinium oxide or dysprosium oxide or to the sum of the molar proportions of gadolinium oxide and dysprosium oxide.

The materials are preferably present in a molar ratio of from 2.6:1 to 1:1.3, where again the last number relates to the molar proportion of gadolinium oxide or dysprosium oxide or to the sum of the molar proportions of gadolinium oxide and dysprosium oxide.

If a mixture of gadolinium oxide and dysprosium oxide is employed, the respective proportion of the individual substances with respect to one another is not crucial per se. It can be set in a broad ratio, in particular in a ratio of from 99:1 to 1:99.

If the refractive indices which can be achieved by coatings with the individual components are considered, these are from about 2.3 to 2.4 in the case of coatings with titanium dioxide, while refractive indices of from about 1.75 to 1.9 can be obtained with pure gadolinium oxide layers and with pure dysprosium oxide layers.

In general, layers having refractive indices which are between the two individual values, depending on the molar proportion of the components, can be achieved with mixtures of two components. A relatively high molar proportion of a component having a rather low refractive index would accordingly result in a refractive index of the mixture which is closer to the refractive index of the component of low refractive index than to the refractive index of the component of relatively high refractive index.

It has therefore surprisingly been found that mixtures comprising titanium dioxide and gadolinium oxide and/or dysprosium oxide, preferably in the molar proportions described above, enable the production of layers having refractive indices which are significantly higher than the mixed values to be expected and in particular are close to the refractive index of pure titanium dioxide. Specifically, layers having refractive indices of significantly above 2.0, namely in the range from about 2.20 to about 2.30, can be produced with these mixtures. The defined refractive index desired in each case can be set specifically within this range via the molar proportion of gadolinium oxide and/or dysprosium oxide. A relatively high proportion of one or both of these components then results in a slight lowering of the refractive index obtained.

If both gadolinium oxide and dysprosium oxide are employed in the mixture, the respective molar proportion of these two substances does not, by contrast, have a significant influence on the refractive index which can be obtained with the titanium dioxide-containing total mixture. This applies in particular if the sum of the molar proportions of the mixture is in the above-mentioned limits.

Furthermore, it has advantageously been found that the vapour-deposition materials according to the invention evaporate virtually congruently, i.e. their composition does not change significantly over the course of the evaporation process. In this way, homogeneous layers having a stable high refractive index of $n \geq 2.0$, in particular of $n \geq 2.20$, can be produced.

In addition, the optical layers obtained have high transparency in a broad spectral range, i.e. from about 380 nm to 5 μm. In particular, complete transparency can be achieved in the visible and near infrared spectral regions.

Compared with the vapour-deposition materials known from the prior art for the production of layers of high refractive index, the layers produced from the vapour-deposition material according to the invention have improved durability. This is particularly the case in a moist-warm environment, since the vapour-deposition materials according to the invention do not tend to take up moisture. This property proves to be very advantageous as early as during preparation of the vapour-deposition materials since special measures for handling and further processing of the mixtures are unnecessary. However, the layers of high refractive index formed after deposition on suitable substrates are also particularly stable in a moist-warm environment. Improved durability to acids and alkalis can likewise be observed.

A further advantage of the vapour-deposition materials of the present invention consists in that the substances used have no radioactive isotopes. Neither the vapour-deposition materials themselves nor the layers produced therewith therefore emit radioactively, meaning that safety measures are unnecessary and damage in this respect to optical components or detectors which come into contact with the layers is not to be expected.

In a further embodiment of the invention, the vapour-deposition material for the production of optical layers of high refractive index comprises titanium dioxide, titanium and gadolinium oxide ($Gd_2O_3$) and/or dysprosium oxide ($Dy_2O_3$).

Due to the addition of metallic titanium, a substoichiometric ratio of the mixture with respect to oxygen is set in this case. Release of oxygen during melting and evaporation of the mixture is thereby avoided. This also improves the handling of the vapour-deposition material, since the spitting which otherwise usually occurs during melting and evaporation can be prevented. In this way, the mixture attains a particularly stable composition, which does not change throughout the subsequent processing.

Here too, the molar ratio of titanium oxide to gadolinium oxide and/or dysprosium oxide can be from 4:1 to 1:4, but preferably from 2.6:1 to 1:1.3, where the last number in each case relates to the molar proportion of gadolinium oxide or dysprosium oxide or to the sum of the molar proportions of gadolinium oxide and/or dysprosium oxide.

In the case where a mixture of gadolinium oxide and dysprosium oxide is used, the proportions of the individual substances with respect to one another can be varied within the molar proportion of the two substances in a ratio of from 99:1 to 1:99.

A mixture of titanium dioxide, titanium and dysprosium oxide has proven particularly advantageous.

With respect to the parts by weight, the following ratios are advantageously set: from 50 to 92 parts by weight of gadolinium oxide and/or dysprosium oxide, from 7 to 42 parts by weight of titanium dioxide and from 0 to 8 parts by weight of titanium, based on the total weight of the mixture. Preference is given to the use of from 67 to 76 parts by weight of gadolinium oxide and/or dysprosium oxide, from 15 to 27 parts by weight of titanium dioxide and from 2 to 5 parts by weight of titanium, based on the total weight of the mixture.

With respect to the achievable refractive indices of the optical layers obtained with the material, the addition of metallic titanium has no disadvantageous effects. Here too, refractive indices of greater than 2.0 and in particular of from 2.20 to 2.30 can be obtained.

All advantages already described above for the vapour-deposition materials according to the invention without addition of titanium also apply to the mixtures comprising metallic titanium in addition to titanium dioxide and gadolinium oxide and/or dysprosium oxide.

This means that the mixtures can be processed well, and homogeneous layers having a stable high refractive index which are non-absorbent and transparent in a broad spectral range and in addition are stable in a moist-warm environment and do not emit radioactive radiation are obtained therewith.

The vapour-deposition materials according to the invention are prepared by a process in which titanium oxide is mixed with gadolinium oxide and/or dysprosium oxide, the mixture is compressed or suspended, shaped and subsequently sintered.

Titanium oxide and gadolinium oxide and/or dysprosium oxide are advantageously mixed intimately with one another in a molar ratio of from 4:1 to 1:4 and in particular in a molar ratio of from 2.6:1 to 1:1.3, where the last number in each case relates to the molar proportion of gadolinium oxide or dysprosium oxide or to the sum of the molar proportions of gadolinium oxide and/or dysprosium oxide.

The mixture is compressed and shaped by means of suitable compression measures known per se. However, it is also possible to prepare a suspension of the mixed components in a suitable carrier medium, which is shaped and subsequently dried. A suitable carrier medium is, for example, water, to which, if necessary, binders, such as polyvinyl alcohol, methyl-cellulose or polyethylene glycol, and, if desired, assistants, such as, for example, wetting agents or anti-foams, are added. The suspension operation is followed by shaping. In this, various known techniques, such as extrusion, injection moulding or spray drying, can be used. The shapes obtained are dried and freed from the binder, for example by burning out. This is carried out for reasons of better handling and metering of the mixtures. The shapes into which the mixture is converted are therefore not limited. Suitable shapes are all those which facilitate simple handling and good metering, which play a special role, in particular, in the continuous coating of substrates with the vapour-deposition material according to the invention and the replenishment process which is necessary for this purpose. Preferred shapes are therefore various tablet shapes, pellets, discs, truncated cones, grains or granules, rods or also beads.

The shaped mixtures are subsequently sintered. The sintering process here can be carried out under various conditions. For example, sintering can be carried out in air at temperatures of from 1200 to 1600° C., under an inert gas, such as, for example, argon, at temperatures of from 1200 to 1600° C., or under reduced pressure at temperatures of from 1300 to 1700° C. and a residual pressure of less than 1 Pa. It is advantageous here that the sintering process does not, as otherwise generally usual, necessarily have to be carried out under reduced pressure. This both reduces the equipment complexity and saves time.

The shaped sintered products formed remain in their shape during storage, transport and introduction into the evaporation apparatus and are stable in their composition during the entire subsequent melting and evaporation process.

However, particularly stable vapour-deposition materials are obtained if titanium dioxide is mixed with titanium, gadolinium oxide and/or dysprosium oxide, compressed or suspended, shaped and subsequently sintered.

Regarding the molar mixing ratios, the nature of the mouldings and the sintering conditions, no changes arise to the above-mentioned details regarding the vapour-deposition materials according to the invention without addition of metallic titanium.

During the mixing, weight ratios of from 50 to 92 parts by weight of gadolinium oxide and/or dysprosium oxide, from 7 to 42 parts by weight of titanium oxide and from 0 to 8 parts by weight of titanium, based on the total weight of the mixture, are preferably set. Particular preference is given to the preparation of a mixture comprising from 67 to 76 parts by weight of gadolinium oxide and/or dysprosium oxide, from 15 to 27 parts by weight of titanium oxide and from 2 to 5 parts by weight of titanium, based on the total weight of the mixture.

While maintaining the above-mentioned mixing ratios, a mixture of dysprosium oxide, titanium dioxide and titanium has proven particularly advantageous.

After the sintering and cooling, the vapour-deposition material according to the invention is ready for use for the production of optical layers of high refractive index having a refractive index of $n \geq 2.0$, in particular $n \geq 2.20$.

The vapour-deposition material according to the present invention can be used to coat all suitable substrates, in particular panes, prisms, sheets, shaped substrates, such as optical lenses, spectacle lenses and camera lenses and the like, which can consist of the known suitable materials, such as various glasses or plastics. Regarding the nature, size, shape, material and surface quality of the substrates to be coated, the use of the vapour-deposition materials according to the invention is therefore not subjected to any restrictions at all so long as the substrates can be introduced into the vacuum apparatus and remain stable under the prevailing temperature and pressure conditions. However, it has proven advantageous, in order to increase the density of the applied layers, to heat the substrates before and during the coating operation, so that the vapour-deposition material hits a pre-heated substrate.

Depending on the nature of the substrates employed, they are heated to temperatures of up to 300° C. However, this measure is known per se.

The vapour-deposition process employed is usually a high-vacuum vapour-deposition process in which the vapour-deposition material is introduced into a vacuum apparatus in a suitable flask, also known as evaporation crucible or boat, together with the substrate to be coated.

The apparatus is subsequently evacuated, and the vapour-deposition material is caused to evaporate by heating and/or electron beam bombardment. The vapour-deposition material precipitates on the substrate in the form of a thin layer.

During the evaporation, oxygen is advantageously added in order to ensure complete oxidation of the layers. In order to improve the adhesion of the applied layers to, in particular, unheated substrates, the substrate can be bombarded with ions during the coating (ion assisted deposition, plasma assisted deposition).

In general, a plurality of layers, advantageously having alternately high and low ($n \leq 1.80$) refractive indices, are deposited alternately one on top of the other. In this way, multilayered arrangements are formed, which can provide the substrates coated therewith with, inter alia, greatly reduced reflection. However, multilayered arrangements of this type on optical substrates have been known per se for some time and are widely used.

The vapour-deposition materials according to the invention can be used to produce adherent optical layers of high refractive index on suitable substrates which are non-absorbent in a broad spectral range, are transparent and homogeneous, have a high refractive index of, in particular, $n \geq 2.20$, are stable in a moist-warm environment and to acids and alkalis and emit no radioactive radiation.

The invention will be explained below by means of a number of examples, but without being restricted thereto.

EXAMPLE 1

Mixture of $Dy_2O_3$ and $TiO_2$ 68.3% by weight of $Dy_2O_3$ and 31.7% by weight of titanium dioxide are mixed intimately with one another and subsequently shaped into tablets. These are calcined in air at about 1500° C. for 4 hours. The tablets are subsequently introduced into a vapour-deposition unit with electron-beam evaporator, for example of the Leybold A700Q type, and evaporated at temperatures of about 2000° C. and an oxygen pressure of $2 \times 10^{-2}$ Pa. A thin layer is deposited on the quartz glasses located in the apparatus as substrates, which had been heated to about 300° C. before the vapour deposition. The thickness of this layer is set to about 340 nm. After cooling and removal from the evaporation apparatus, the transmission and reflection spectra of the coated glasses are measured using a spectrophotometer. The refractive index of the layer is determined from the spectra. Homogeneous layers are obtained which have a refractive index of 2.28 at a wavelength of 500 nm.

The layers are transparent in the spectral range from 400 nm to about 5 μm and have no absorption in this range. The layers are durable in a moist-warm atmosphere, for example at 80% relative atmospheric humidity and 50° C. and have good hardness and adhesive strength.

The coated substrates are boiled in deionised water for 10 minutes and stored for 6 hours at room temperature in a 4.5% by weight saline solution in deionised water and for 6 hours at room temperature in a 0.01 molar hydrochloric acid solution. Detachment of the applied layer is not observed in any of the sample glasses after the respective test. Spots and/or hazing are not evident.

EXAMPLE 2

Mixture of $Dy_2O_3$, $TiO_2$ and Ti

Tablets are produced from a homogeneous mixture of 71.03% by weight of $Dy_2O_3$, 26.20% by weight of titanium dioxide and 2.77% by weight of titanium and are subsequently calcined under reduced pressure for 10 hours at about 1600° C. at a pressure of $1 \times 10^{-1}$ Pa.

The tablets are subsequently introduced into a vapour-deposition unit with electron-beam evaporator of the Leybold A700Q type, and evaporated at temperatures of about 2000° C. and an oxygen pressure of $2 \times 10^{-2}$ Pa. A thin layer is deposited on the quartz glasses located in the apparatus as substrates, which had been heated to about 300° C. before the vapour deposition. The thickness of this layer is set to about 340 nm. After cooling and removal from the evaporation apparatus, the transmission and reflection spectra of the coated glasses are measured using a spectrophotometer. The refractive index of the layer is determined from the spectra. Homogeneous layers are obtained which have a refractive index of 2.25 at a wavelength of 500 nm.

The layers are transparent in the spectral range from 400 nm to about 5 μm and have no absorption in this range. The layers are durable in a moist-warm atmosphere and have good hardness and adhesive strength.

EXAMPLE 3

Mixture of $Dy_2O_3$, $Gd_2O_3$ and $TiO_2$ 25 mol % of $Dy_2O_3$, 25 mol % of $Gd_2O_3$ and 50 mol % of titanium dioxide are mixed intimately with one another and subsequently shaped into tablets. These are calcined in air at about 1500° C. for 6 hours.

The tablets are subsequently introduced into a vapour-deposition unit with electron-beam evaporator of the Leybold L560 type, and evaporated at temperatures of about 2000° C. and an oxygen pressure of $2 \times 10^{-2}$ Pa. A thin layer is deposited on the quartz glasses located in the apparatus as substrates, which had been heated to about 300° C. before the vapour deposition. The thickness of this layer is set to about 240 nm. After cooling and removal from the evaporation apparatus, the transmission and reflection spectra of the coated glasses are measured using a spectrophotometer. The refractive index of the layer is determined from the spectra. Homogeneous layers are obtained which have a refractive index of 2.2 at a wavelength of 500 nm.

The layers are transparent in the spectral range from 400 nm to about 5 μm and have no absorption in this range. The layers are durable in a moist-warm atmosphere and have good hardness and adhesive strength.

EXAMPLE 4

Mixture of $Gd_2O_3$, $TiO_2$ and Ti

Tablets are produced from a homogeneous mixture of 83.45% by weight of $Gd_2O_3$, 13.79% by weight of titanium dioxide and 2.76% by weight of titanium and are subsequently calcined under reduced pressure for 10 hours at about 1600° C. at a pressure of $1 \times 10^{-1}$ Pa.

The tablets are subsequently introduced into a vapour-deposition unit with electron-beam evaporator of the Leybold L560 type, and evaporated at temperatures of about 1800° C. and an oxygen pressure of $2\times10^{-2}$ Pa. A thin layer is deposited on the quartz glasses located in the apparatus as substrates, which had been heated to about 300° C. before the vapour deposition. The thickness of this layer is set to about 220 nm. After cooling and removal from the evaporation apparatus, the transmission and reflection spectra of the coated glasses are measured using a spectrophotometer. The refractive index of the layer is determined from the spectra. Homogeneous layers are obtained which have a refractive index of 2.2 at a wavelength of 500 nm.

The layers are transparent in the spectral range from 400 nm to about 5 μm and have no absorption in this range. The layers are durable in a moist-warm atmosphere and have good hardness and adhesive strength.

The invention claimed is:

1. A vapour-deposition material for the production of optical layers of high refractive index, consisting of (A) titanium dioxide, titanium metal and at least one of gadolinium oxide or dysprosium oxide, said material being suitable for vapor deposition of said oxides on a substrate.

2. The vapor-deposition material according to claim 1, having a ratio of gadolinium oxide to dysprosium oxide of from 1:99 to 99:1.

3. The vapor-deposition material according to claim 1, consisting of titanium dioxide, titanium metal and at least one of gadolinium oxide or dysprosium oxide.

4. The vapor-deposition material according to claim 3, having a ratio of gadolinium oxide to dysprosium oxide of from 1:99 to 99:1.

5. The vapor-deposition material according to claim 1, consisting of from 50 to 92 parts by weight of gadolinium oxide, dysprosium oxide, or a mixture thereof, from 7 to 42 parts by weight of titanium dioxide and from 0 to 8 parts by weight of titanium, based on the total weight of the vapor deposition material.

6. The vapor-deposition material according to claim 5, consisting of from 50 to 92 parts by weight of dysprosium oxide, from 7 to 42 parts by weight of titanium dioxide and from 0 to 8 parts by weight of titanium, based on the total weight of the vapor deposition material.

7. The vapor-deposition material according to claim 1, consisting of from 67 to 76 parts by weight of gadolinium oxide, dysprosium oxide, or a mixture thereof, from 15 to 27 parts by weight of titanium dioxide and from 2 to 5 parts by weight of titanium, based on the total weight of the vapor-deposition material.

8. The vapor-deposition material according to claim 7, consisting of from 67 to 76 parts by weight of dysprosium oxide, from 15 to 27 parts by weight of titanium dioxide and from 2 to 5 parts by weight of titanium, based on the total weight of the mixture.

9. An optical layer of high refractive index having a refractive index of $n\geq2.0$, comprising a layer consisting of titanium oxide, at least one of gadolinium oxide or dysprosium oxide, and optionally titanium metal, upon a glass or plastic substrate.

10. A process for the preparation of a vapour deposition material according to claim 1, in which titanium dioxide is mixed with gadolinium oxide, dysprosium oxide or a mixture thereof, and titanium is additionally added to the mixture.

11. The process according to claim 10, in which the sintering is carried out with inflow of air.

12. The process according to claim 10, in which the sintering is carried out under reduced pressure.

13. The process according to claim 10, in which the sintering is carried out under an inert gas.

14. The process according to claim 10, in which the mixture is shaped into tablets, panes, pellets, truncated cones, grains, granules, rods or beads.

15. A method for the production of optical layers of high refractive index, comprising depositing on a substrate by vapor deposition a vapor-deposition material according to claim 1.

* * * * *